United States Patent
Krett et al.

(10) Patent No.: US 8,963,636 B1
(45) Date of Patent: Feb. 24, 2015

(54) OUTPHASING POWER AMPLIFIER LINEARIZATION METHOD WITH IMPROVED OUTPUT POWER BACK-OFF EFFICIENCY

(71) Applicants: David L. Krett, Cedar Rapids, IA (US); Timothy L. Kean, Cedar Rapids, IA (US); Gamal M. Hegazi, Vista, CA (US); David W. Rowland, Cedar Rapids, IA (US)

(72) Inventors: David L. Krett, Cedar Rapids, IA (US); Timothy L. Kean, Cedar Rapids, IA (US); Gamal M. Hegazi, Vista, CA (US); David W. Rowland, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 91 days.

(21) Appl. No.: 13/901,790

(22) Filed: May 24, 2013

(51) Int. Cl.
*H03F 3/45* (2006.01)
*H03F 3/217* (2006.01)

(52) U.S. Cl.
CPC ............... *H03F 3/2173* (2013.01); *H03F 3/45* (2013.01)

USPC .......................... 330/251; 330/10; 330/107

(58) Field of Classification Search
CPC ........................................................ H03F 3/45
USPC ................................ 330/10, 107, 251, 207 A
See application file for complete search history.

*Primary Examiner* — Robert Pascal
*Assistant Examiner* — Khiem Nguyen
(74) *Attorney, Agent, or Firm* — Donna P. Suchy; Daniel M. Barbieri

(57) ABSTRACT

A high efficiency outphasing power amplifier is disclosed which provides a high-efficiency, high-linearity outphasing amplifier capable of amplifying complex, wideband, multi-tone signals. Systems herein may amplify at least 256 symbol QAM signals with negligible distortion, while achieving high direct current-to-radio frequency efficiency sustainable at virtually all power levels. Embodiments of the outphasing amplifier employ a bridge output network formed from two complementary Class-D amplifiers to switch a dc supply voltage across the load. In embodiments, the phase of both halves of the bridge is varied from zero to +/−90 or zero to 180 degrees to split the workload, to correct for phase error within the bridge network and to control output power. Because the current through the load and thus through the two halves of the amplifier vary directly with output level, the efficiency remains high even when power output is low.

19 Claims, 18 Drawing Sheets

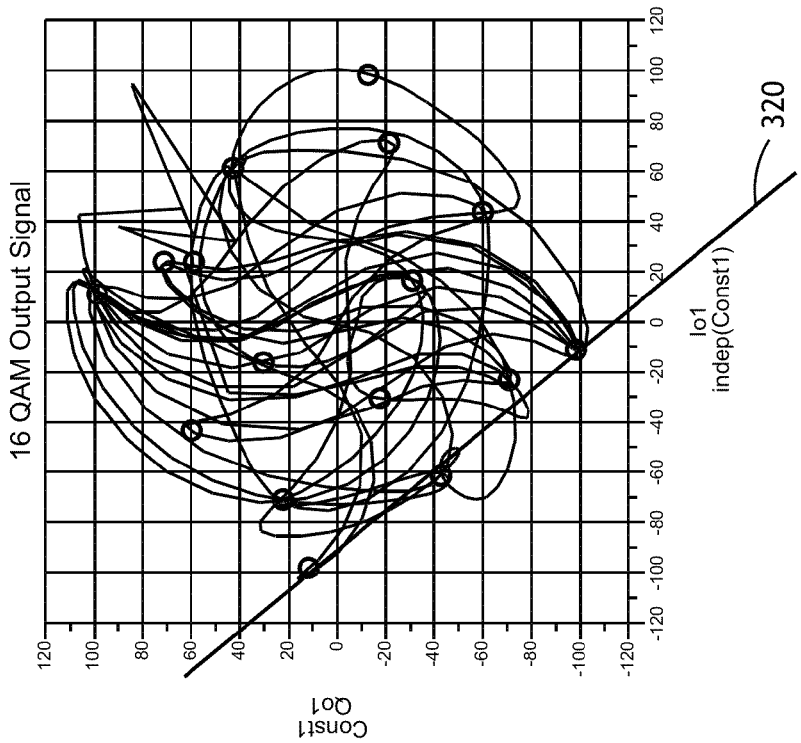
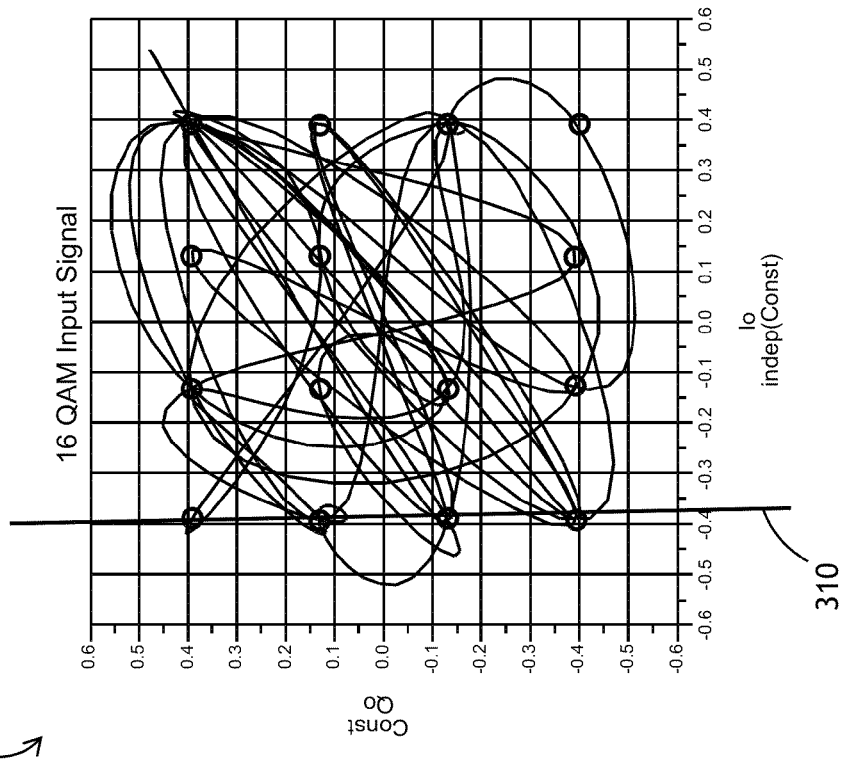
FIG. 3B
FIG. 3A

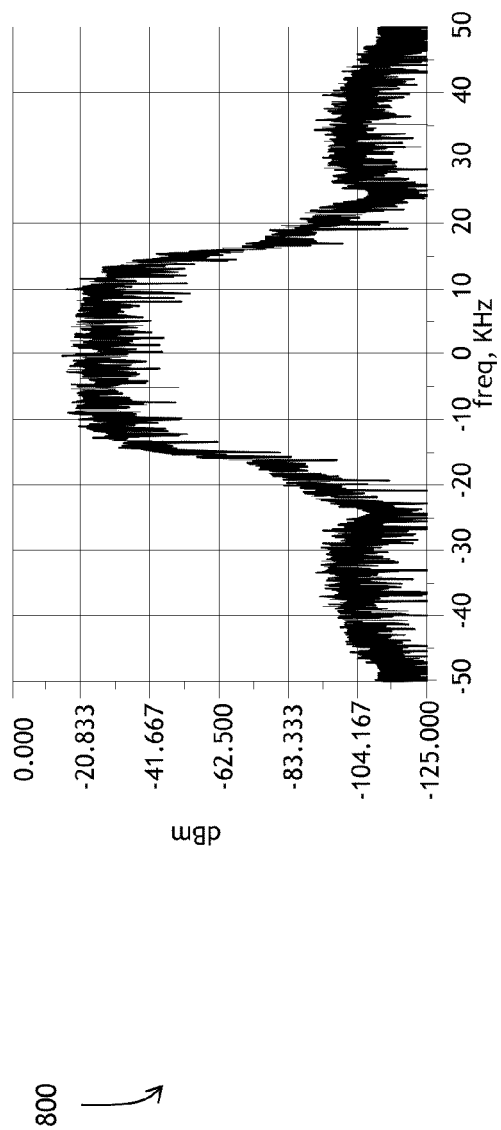
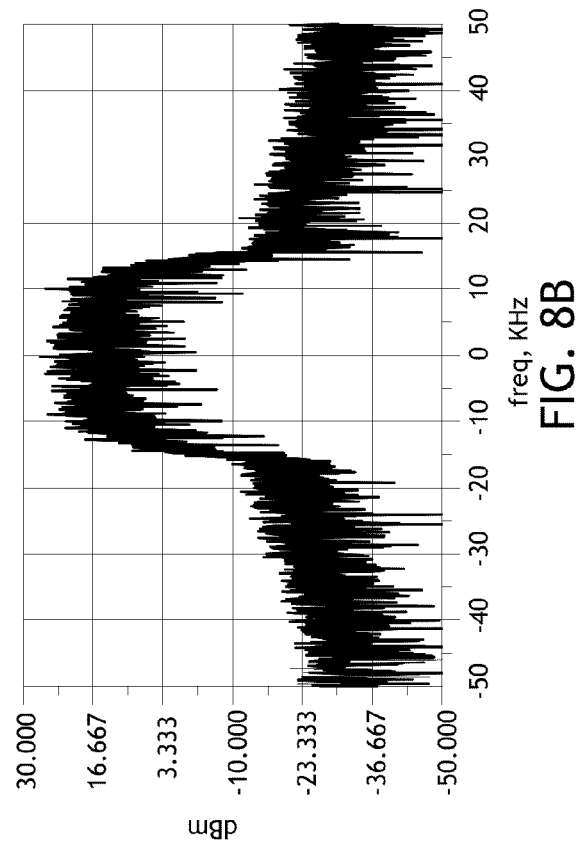
FIG. 8A
FIG. 8B

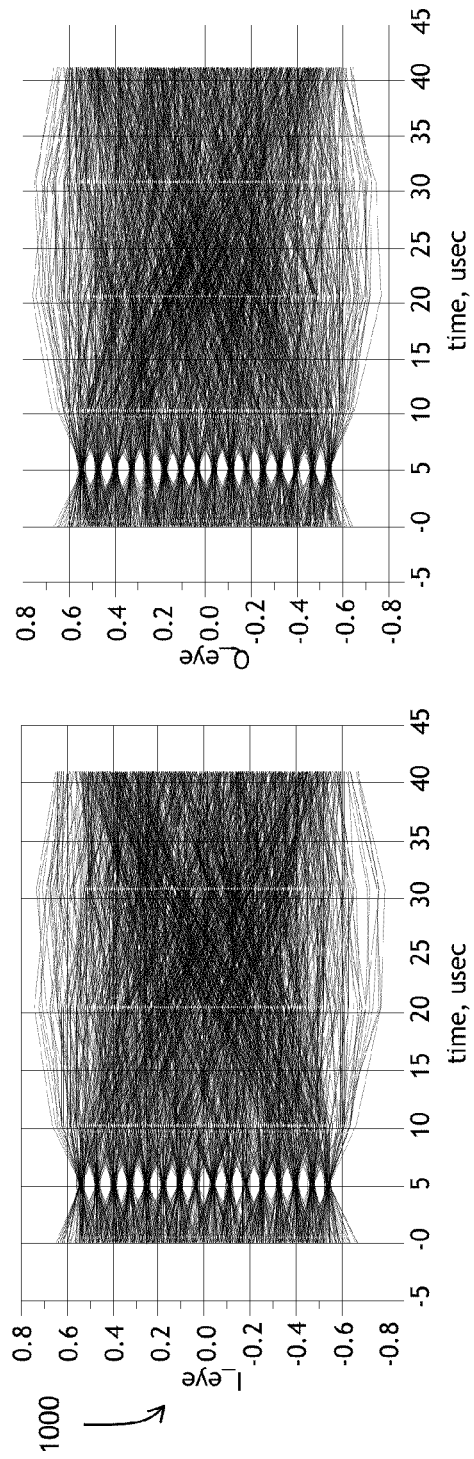
FIG. 10A
FIG. 10B
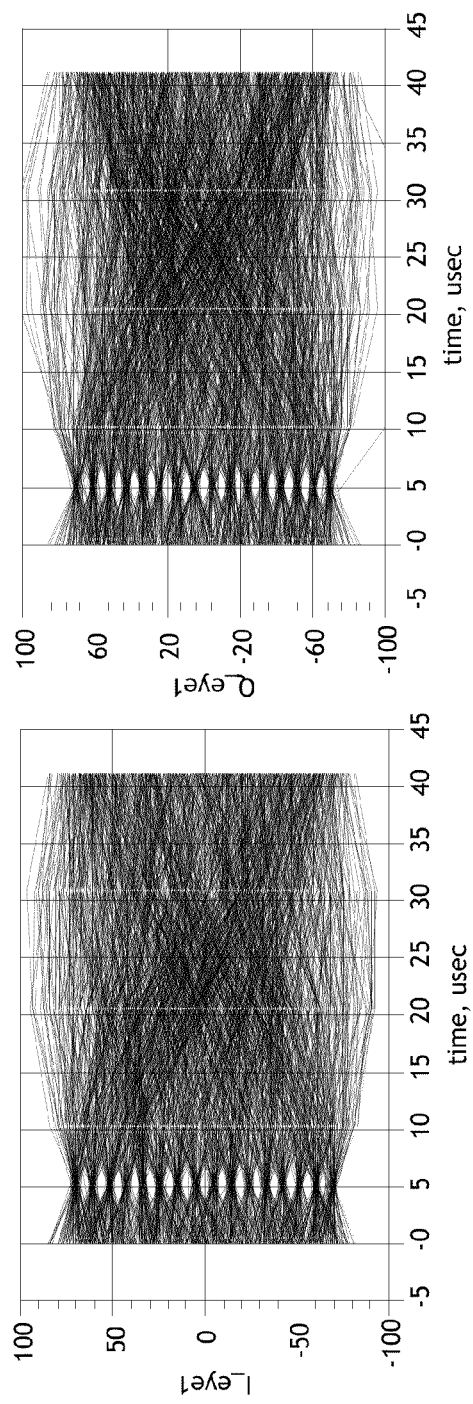
FIG. 10C
FIG. 10D

| Freq (MHZ) | RF Power Out (W) | DC Control Voltage (V) | DC Power In (W) | REL Eff (%) | Relative Mag (dB) |
|---|---|---|---|---|---|
| 6.8 | 2.53 | 0.141 | 3.41 | 74.1 | 0 |
| 6.8 | 2 | 0.115 | 2.71 | 73.8 | -1 |
| 6.8 | 1.59 | 0.0955 | 2.2 | 72.2 | -2 |
| 6.8 | 1.27 | 0.0798 | 1.8 | 70.5 | -3 |
| 6.8 | 0.64 | 0.0484 | 1.03 | 65.9 | -6 |
| 6.8 | 0.31 | 0.0327 | 0.64 | 48.4 | -9 |
| 6.8 | 0.01 | 0.0179 | 0.35 | | -20 |
| 6.8 | | 0.0169 | 0.28 | | -30 |
| 6.8 | | 0.0168 | 0.24 | | -40 |
| 6.8 | | 0.0167 | 0.24 | | Limit -50 |

1500

| | |
|---|---|
| 1702 | transmitting a RF delay line frequency information, the RF delay line frequency information based on a radio frequency (RF) input |
| 1704 | transmitting a phase lock signal, the phase lock signal based on the RF input and a forward directional RF output signal |
| 1706 | transmitting a first RF delay control signal, the first RF delay control signal based on the phase lock signal and a reference current |
| 1708 | transmitting a second RF delay control signal, the second RF delay control signal based on a filtered RF input and a forward directional RF output signal |
| 1710 | shifting the phase of the RF input from zero degrees to one hundred eighty degrees based on the RF delay line frequency information and the first RF delay control signal |
| 1712 | transmitting a first shifted RF input to a first half bridge |
| 1714 | shifting the phase of the RF input from zero degrees to one hundred eighty degrees based on the RF delay line frequency information and the second RF delay control signal |
| 1716 | transmitting a second shifted RF input to a second half bridge |
| 1718 | transmitting a phase corrected output signal through an output filter, the phase corrected output signal based on the first and second shifted RF inputs |
| 1720 | receiving and splitting the phase corrected output signal into the forward directional RF output signal and a reflected directional RF output signal |
| 1722 | transmitting a filtered phase corrected output signal |
| 1724 | transmitting the forward directional RF output signal to a digital phase lock loop and to an amplitude error amplifier |
| 1726 | compensating for the second shifting means to cancel a phase shift within the means for transmitting a phase corrected output signal |

# OUTPHASING POWER AMPLIFIER LINEARIZATION METHOD WITH IMPROVED OUTPUT POWER BACK-OFF EFFICIENCY

FIELD OF THE INVENTION

The present invention relates generally to power amplification systems and components thereof. More particularly, embodiments of the present invention relate to a system and method for accurate linearization of an outphased power amplifier resulting in efficient output as power is backed-off.

BACKGROUND OF THE INVENTION

Traditional High Efficiency Power Amplifiers are often very efficient while operating at full power, such as those using the Envelope Elimination and Restoration (EER) method of linearization a non-linear power amplifier through high-level modulators. However, the efficiency of the EER methods undesirably drops as the power level decreases (e.g., power back-off) stressing the envelope amplifier through recreation of the original signal. Similarly, linearization methods employing Linear Application using Non-linear Components (LINC) transmitters suffer degraded efficiency at power levels backed off from peak as they use an inefficient RF dump resistor in their output combiner.

In addition, when these amplifiers are operated with wideband waveforms having high peak-to-average ratios, such as Quadrature Amplitude Modulation (QAM), Wideband Code Division Multiple Access (WCDMA), or Orthogonal Frequency Division Multiplexing (OFDM), the net efficiency is considerably less than the efficiency at high power levels. Since the average power is often 6-10 dB below peak levels, these traditional methods suffer a degraded efficiency during average use. Further, high-level modulators limit the modulation bandwidth of the wideband waveforms as they struggle to follow the widely varying signal envelopes.

Consequently, a need remains for an efficient alternative operable at average power levels backed off from peak power to overcome the shortcomings of traditional inefficient high power amplifiers.

SUMMARY OF THE INVENTION

Accordingly, an embodiment of the present invention is directed to a system for linearization of an outphased power amplifier for improved output power back off efficiency, comprising: a frequency counter configured for receiving a radio frequency (RF) input and transmitting a RF delay line frequency information, the RF delay line frequency information based on the RF input; an amplitude error amplifier configured for: receiving a filtered RF input, receiving a forward directional RF output signal, transmitting a RF delay control signal, the RF delay control signal based on the filtered RF input and the forward directional RF output signal, a first phase shifter configured for: receiving the RF input, receiving the RF delay line frequency information, receiving the RF delay control signal, shifting the phase of the RF input from zero degrees to positive ninety degrees based on the RF delay line frequency information and the RF delay control signal, and transmitting a first shifted RF input to a first half bridge, a second phase shifter configured for: receiving the RF input, receiving the RF delay line frequency information, receiving the RF delay control signal, shifting the phase of the RF input from zero degrees to negative ninety degrees based on the RF delay line frequency information and the RF delay control signal, transmitting a second shifted RF input to a second half bridge, a half-bridge output network, the half-bridge output network including the first half bridge and the second half bridge, the half-bridge output network comprising at least two complementary Class-D amplifiers configured to receive the first and second shifted RF inputs from each of the first and the second half bridges, switch a dc supply voltage across a load, and transmit a phase corrected output signal through an output filter, a RF directional coupler configured for: receiving the phase corrected output signal, splitting the phase corrected output signal into the forward directional RF output signal and a reflected directional RF output signal, and transmitting a filtered phase corrected output signal, and transmitting the forward directional RF output signal to the amplitude error amplifier.

An additional embodiment of the present invention is directed to the frequency counter further configured to provide each of the left first and second phase shifters with a digital word, the digital word allowing each phase shifter to make a course change when changing a frequency band and the amplitude error amplifier further configured with a precision RF detector and a low pass filter prior to the amplitude error amplifier.

An additional embodiment of the present invention is directed to the half-bridge output network further comprising a comparator prior to each of the first and second half bridge and the half-bridge output network further comprising an isolation transformer configured to receive each signal from the first and second half bridge and transmit the phase corrected signal to the RF directional coupler.

An additional embodiment of the present invention is directed to a system for linearization of an outphased power amplifier for improved output power back off efficiency, comprising: a frequency counter configured for receiving a radio frequency (RF) input and transmitting a RF delay line frequency information, the RF delay line frequency information based on the RF input, a digital phase lock loop configured for: receiving the RF input, receiving a forward directional RF output signal, and transmitting a phase lock signal, an phase error amplifier configured for: receiving the phase lock signal, receiving a reference current, and transmitting a first RF delay control signal, the first RF delay control signal based on the phase lock signal and the reference current, an amplitude error amplifier configured for: receiving a filtered RF input, receiving the forward directional RF output signal, and transmitting a second RF delay control signal, the second RF delay control signal based on the filtered RF input and the forward directional RF output signal, a first phase shifter configured for: receiving the RF input, receiving the RF delay line frequency information, receiving the first RF delay control signal, shifting the phase of the RF input from zero degrees to one hundred eighty degrees based on the RF delay line frequency information and the first RF delay control signal, and transmitting a first shifted RF input to a first half bridge, a second phase shifter configured for: receiving the first shifted RF input, receiving the RF delay line frequency information, receiving the second RF delay control signal, shifting the phase of the RF input from zero degrees to one hundred eighty degrees based on the RF delay line frequency information and the second RF delay control signal, and transmitting a second shifted RF input to a second half bridge, a half-bridge output network, the half-bridge output network including the first half bridge and the second half bridge, the half-bridge output network comprising at least two complementary Class-D amplifiers configured to receive the first and second shifted RF inputs from each of the first and the second half bridges, switch a dc supply voltage across a load, and transmit a phase corrected output signal through an output filter, a RF directional coupler configured for: receiving the phase corrected output signal, splitting the phase corrected output signal into the forward directional RF output signal and a reflected directional RF output signal, and transmitting a filtered phase corrected output signal, and transmitting the forward directional RF output signal to the digital phase lock loop and to the amplitude error amplifier, wherein the first phase shifter is configured to compensate for the second phase shifter shifting the phase of the RF input, the compensation configured to cancel any phase shift within the half-bridge output network.

An additional embodiment of the present invention is directed to a method for linearization of an outphased power amplifier for improved output power back off efficiency, comprising: means for transmitting a RF delay line frequency information, the RF delay line frequency information based on a radio frequency (RF) input, means for transmitting a phase lock signal, the phase lock signal based on the RF input and a forward directional RF output signal, means for transmitting a first RF delay control signal, the first RF delay control signal based on the phase lock signal and a reference current, means for transmitting a second RF delay control signal, the second RF delay control signal based on a filtered RF input and a forward directional RF output signal, a first shifting means for shifting the phase of the RF input from zero degrees to one hundred eighty degrees based on the RF delay line frequency information and the first RF delay control signal, means for transmitting a first shifted RF input to a first half bridge, a second shifting means for shifting the phase of the RF input from zero degrees to one hundred eighty degrees based on the RF delay line frequency information and the second RF delay control signal, means for transmitting a second shifted RF input to a second half bridge, means for transmitting a phase corrected output signal through an output filter, the phase corrected output signal based on the first and second shifted RF inputs, means for receiving the phase corrected output signal, means for splitting the phase corrected output signal into the forward directional RF output signal and a reflected directional RF output signal, means for transmitting a filtered phase corrected output signal, means for transmitting the forward directional RF output signal to a digital phase lock loop and to an amplitude error amplifier, and means for compensating for the second shifting means to cancel a phase shift within the means for transmitting a phase corrected output signal.

An additional embodiment of the present invention is directed to the means for transmitting a RF delay line frequency information further configured with a providing means for providing each of the first and second shifting means with a digital word, the digital word allows each of the first and second shifting means to make a course change when changing a frequency band and the means for transmitting a phase lock signal further comprises a means for precise detection of the RF input and a means for filtering the phase lock signal.

An additional embodiment of the present invention is directed to the means for transmitting a phase lock signal further comprising a means for comparing a phase of at least two input signals and the first shifting means further comprises one of: a means for shifting a phase from zero to positive ninety degrees, and a compensation means for correcting a phase error within the means for transmitting a phase corrected output signal.

An additional embodiment of the present invention is directed to the second shifting means further comprising one of: a shifting means for shifting a phase from zero to negative ninety degrees, and a shifting means for shifting a phase from zero to one hundred eighty degrees and the means for splitting the phase corrected output signal further comprises a receiving means and a dividing means, the dividing means for dividing the phase corrected output signal into at least three signals including at least one of: a filtered phase corrected output signal, a forward directional RF output signal, and a reflected directional RF output signal.

An additional embodiment of the present invention is directed to the means for compensating for the second shifting means further comprises a phase correction based on the forward directional RF output signal.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIGS. 3A and 3B are constellation diagrams of an input signal and, after a counterclockwise rotation, an output signal indicative of distortion curable by an embodiment of the present invention;

FIGS. 8A and 8B are graphs of a 256 QAM input and output signal in dBm over frequency exemplary of an embodiment of the present invention;

FIGS. 10A, 10B, 10C & 10D are eye diagrams of input and output signals exemplary of an embodiment of the present invention;

FIG. 17 is a flow diagram for a method for improved linear outphasing power amplifier with improved power back off efficiency exemplary of an embodiment of the present invention.

DETAILED DESCRIPTION OF THE INVENTION

Figure 1:
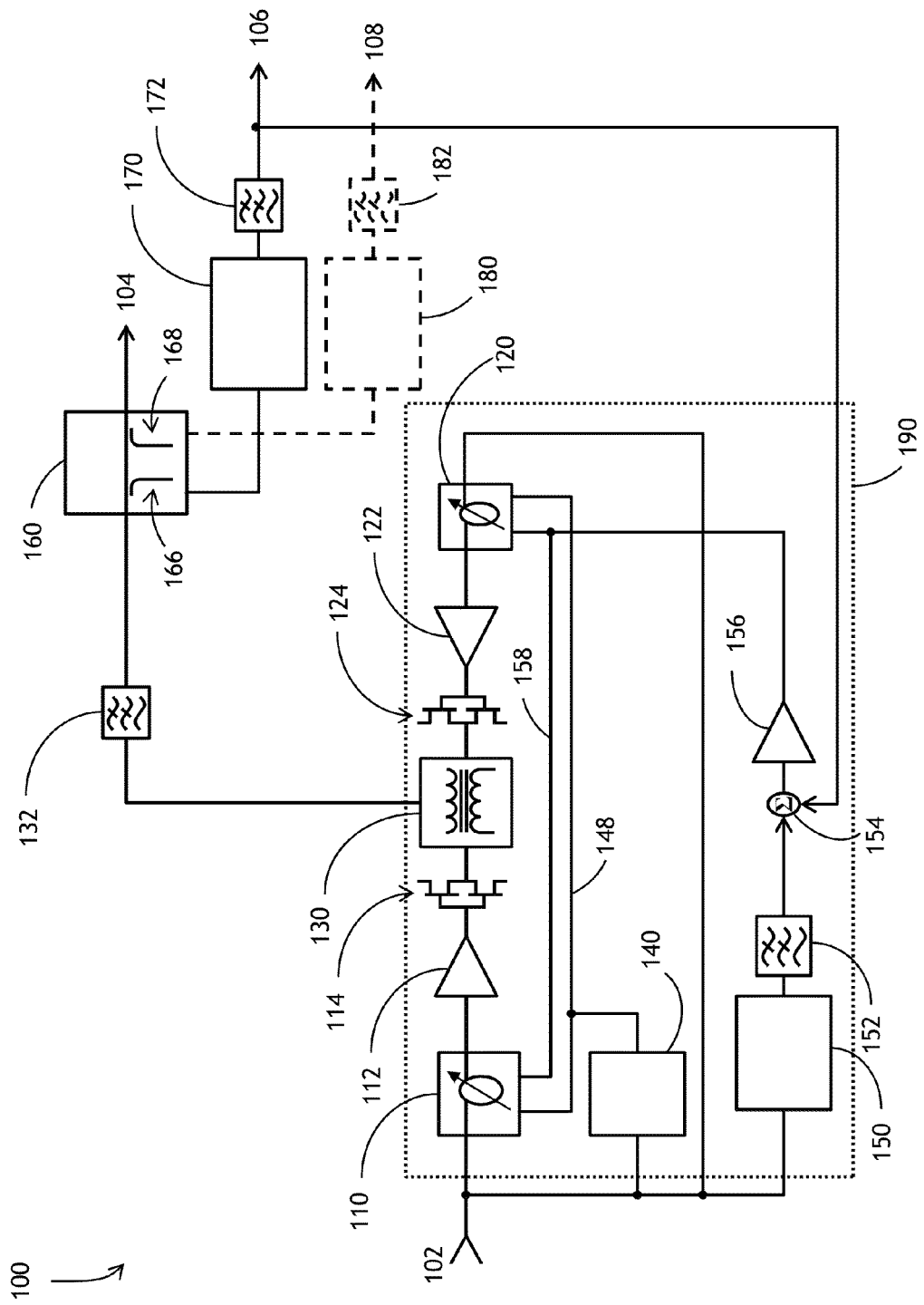
FIG. 1 is a diagram of a system for outphasing power amplifier with improved power back-off efficiency illustrative of an embodiment of the present invention.

Reference will now be made in detail to the presently preferred embodiments of the invention, examples of which are illustrated in the accompanying drawings.

The following description presents certain specific embodiments of the present invention. However, the present invention may be embodied in a multitude of different ways as defined and covered by the claims. In this description, reference is made to the drawings wherein like parts are designated with like numerals throughout.

Embodiments of the present invention are directed to a high efficiency linear power amplifier capable of low distortion even as the systems and methods herein back-off the power from a maximum amplifier power level. One method may include splitting an input signal into two constant amplitude signals which the system feeds into either half of an H-bridge output stage. The system employs a class D switching amplifier routing a first zero degree signal to a first side of the H-bridge while it routes a second variable from 0 to 180 degrees signal to a second side of the H-bridge. The phase variability of the second signal according to the amplitude of the input signal. The system operates at full output when it commands the two signals to enter in-phase. Conversely the system operates at zero output when it adjusts the second side of the H-bridge to command the signals to enter at 180 degrees out of phase. The system adjusts the phase of each signal targeting an output power level from zero to full output.

Embodiments of the present invention are directed to an outphasing amplifier employing a bridge output network formed from two complementary Class-D amplifiers to switch a DC supply voltage across the load. The phase of one half of the bridge may remain constant, while the phase of the other may be adjusted from 0 through 180 degrees to control output power. Because the current through the load and thus through the two halves of the bridge vary directly with output level, the efficiency remains high even when power output is low.

One advantage embodiments herein may provide includes a high level efficiency as the system backs down power from a maximum level. For example, embodiments of the present invention may present efficiency vs. output power at acceptable levels as the system backs off power approximately 6-9 dB below the full output power of the amplifier.

Embodiments of the out-phasing amplifier of the present invention may benefit nearly any linear power amplifier design, particularly networking radios employing high PAR signals, and high output amplifiers drawing significant prime power. For example, small handheld radios, though lower in power output, may quickly drain batteries and generate considerable heat, making their operating duty cycles low and causing discomfort to their users. High-power amplifiers generating several kilowatts of power have tremendous power draws and require elaborate cooling systems. Embodiments of the present invention may allow for these systems to lower user cost and improve reliability, while simplifying cooling requirements.

Embodiments of the present invention may provide a high-efficiency, high-linearity outphasing amplifier capable of amplifying complex, wideband, multi-tone signals. Systems herein may amplify at least 256 symbol QAM signals with negligible distortion, while achieving high DC-to-RF efficiency sustainable at virtually all power levels.

Referring to FIG. 1, a diagram of a system for outphasing power amplifier with improved power back-off efficiency illustrative of an embodiment of the present invention is shown.

One advantage embodiments of the present invention may provide includes splitting the phase shifting work between two halves of the H-bridge. For example, in one embodiment, the system commands one-half of the bridge to shift the phase between zero and 90 degrees of phase shift while the system commands the second half of the bridge to shift the phase variable between zero and minus 90 degrees of phase shift. One reason to split the phase shifting work between halves of the H-bridge may include alleviation of the non-linearity of systems where all of the work is done by one-half of the H-bridge. Systems which incorporate a one sided workload may lead to undesirable increased distortion.

One embodiment of the present invention includes system 100. Radio Frequency (RF) signal 102 enters system 100 from the left and splits three ways: to variable RF delay line left 110, to frequency counter 140, and to precision RF detector 150. Frequency counter 140 provides one of the inputs to variable RF delay line left 110 and to variable RF delay line right 120.

Precision RF detector 150 provides amplitude error amplifier 154, 156 a signal through low pass filter 152. Additionally, system 100 commands power amplifier output signal 106 input to amplitude error amplifier 154, 156 as an input. RF delay control signal 158 emerges from amplitude error amplifier 154, 156 and provides an additional phase control input to each of the variable RF delay lines left 110 and right 120.

Frequency counter 140 provides an input to each of the variable RF delay lines left 110 and right 120 to enable coverage of the wide bandwidth for which system 100 is applicable. These inputs to each RF delay line provide the delay lines with a digital word that allows them to make a course change when changing frequency bands.

Variable RF delay lines left 110 and right 120 vary the phase of each signal in response to system 100 RF delay line frequency information 148 and RF delay control signal 158.

Once the signal leaves variable RF delay lines left 110 and right 120, the signal passes through respective comparators left 112 and right 122 to square and speed up the signal and configure it with a constant amplitude for entry into class "D" half bridges left 114 and right 124. Half bridges (H-bridges) left 114 and right 124 provide class D amplification to isolation transformer 130.

System 100 completes the amplification and transformation of the signal via low pass filter 132 routed to RF directional coupler 160. RF directional coupler 160 routes 1) RF out signal 104, 2) forward directional RF output signal 106, and 3) reflected directional RF output signal 108. RF directional coupler 160 outputs forward directional RF output signal 106 through the forward coupler 166 and a reflected directional RF output signal 108 through the reflected coupler 168 respectively. Forward signal precision RF detector 170 transforms the forward directional RF output signal from coupler 166 to a time-varying analog signal representing the modulated RF envelope which is subsequently routed through low pass filter 172 making it available for input to amplitude error amplifier 154, 156 as well as to power amplifier control circuitry (not pictured).

System 100 may optionally include additional precision RF detector 180 available for transforming and routing of the reflected directional RF output signal from coupler 168 through low pass filter 182 producing reflected output control signal 108 to power amplifier control circuitry.

Additionally, system 100 may be implemented in a software solution incorporated in, for example, a software defined radio. In one embodiment, system 100 software component may be implemented as a single chip 190 capable of accurate representation of functionality of system 100.

Figure 2:
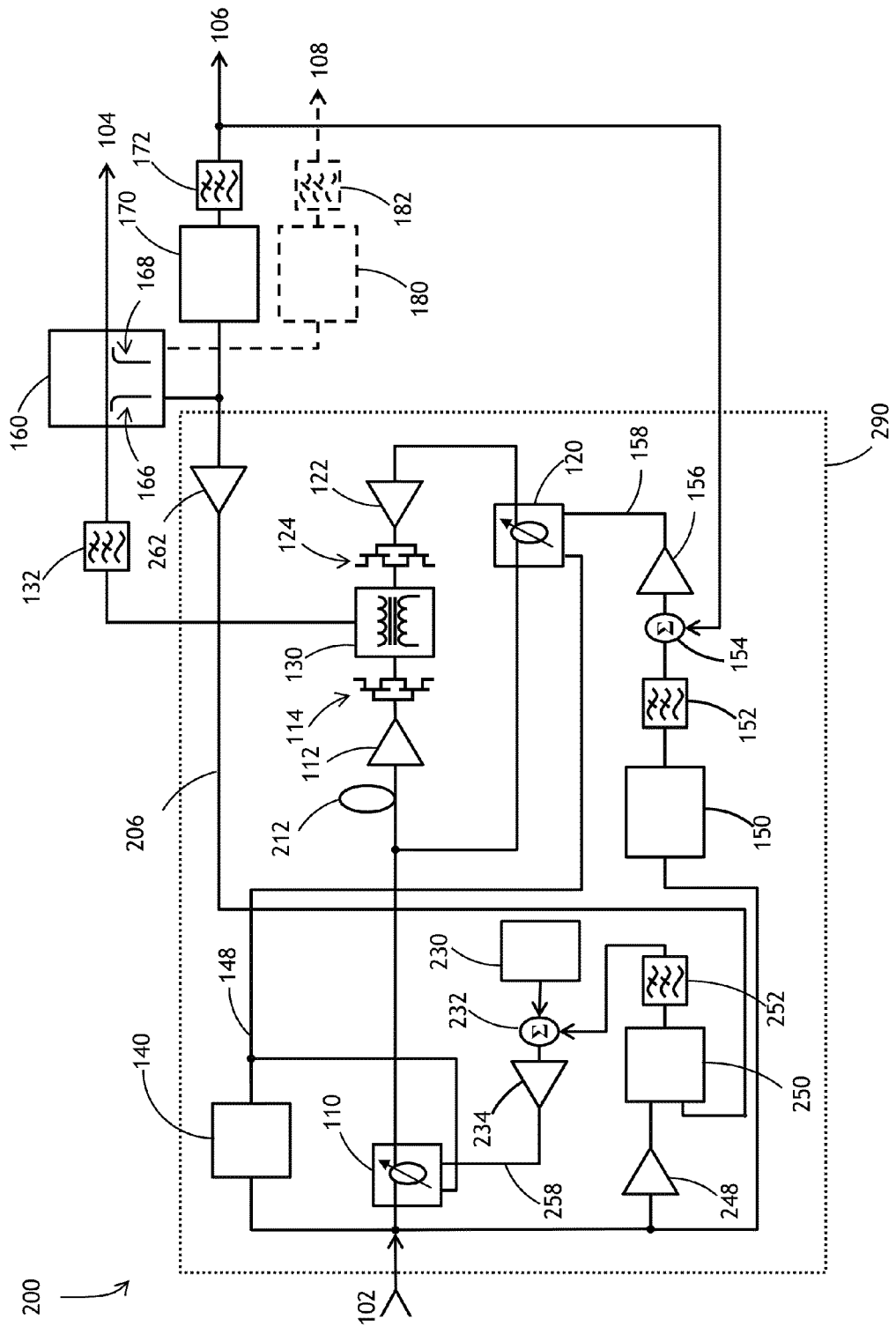
FIG. 2 is a diagram of a system for outphasing power amplifier with improved power back-off efficiency illustrative of an embodiment of the present invention.

Referring to FIG. 2, a diagram of a system for outphasing power amplifier with improved power back-off efficiency illustrative of an embodiment of the present invention is shown. System 200 may incorporate similar elements as system 100. However, system 200 maintains additional goals including a phase correction on both sides of the isolation transformer.

As RF in signal 102 enters, system 200 splits the signal four ways to frequency counter 140, variable RF delay line left 110, to comparator 248 and to precision RF detector 150. Precision RF detector 150 maintains similar function in detection of amplitude of RF in signal 102 and filtering the signal through low pass filter 152. System 200 then provides the signal to amplitude error amplifier 154, 156 to combine with forward output signal 106 to create RF delay control signal 158 available to variable RF delay right 120.

Frequency counter 140 provides similar function in creation of RF delay line frequency information 148 which system 200 controls both variable RF delay lines left 110 and right 120.

Comparator 248 receives RF in signal 102 and sends to digital phase lock loop 250 for phase comparison with amplitude limited RF signal 206. Amplitude limited RF signal 206, used for comparison, results from the forward coupler 166 sending the forward signal through comparator 262. From digital phase lock loop 250 system 200 filters through low pass filter 252 and provides the signal to phase error amplifier 232, 234. System 200 compares the output of the phase lock loop 250 with an input from DC reference 230 in phase error amplifier 232, 234 to create phase corrected left RF delay control signal 258.

System 200 then preferably routes variable phase signal provided by variable RF delay line left 110 to 1) phase balancer 212 and variable RF delay line right 120. Phase balancer 212 operates to ensure the phase of the signal entering the left side of the half bridge is configured correctly to balance the phase of the left signal as compared to the right.

In application, phase balancer 212 may operate to property configure the phase of the signal entering from either side of isolation transformer 130. For example, in a practical implementation of system 200, a coaxial cable distance of variable RF delay line right 120 may be greater than that of the left 110 requiring a phase balancer 212 to be incorporated within the right side of isolation transformer 130. Embodiments herein provide for operator flexibility in physical siting of necessary components.

Variable RF delay line right 120 functions with inputs 1) RF delay line frequency information 148 and 2) RF delay control signal 158 similarly to system 100. This configuration may ensure variable RF delay line right 120 corrects for any amplitude errors and phase shift the signal from zero to 180 degrees.

It is further contemplated herein: multiple corrections to the phase of input RF signal 102 may be configured to further enhance and prepare a signal for entry to one or both sides of the H-bridge. For example, within the scope of this invention, a plurality of corrections may be incorporated to variable RF delay line right 120 and left 110. These corrections may incorporated within hardware and or software to further configure and correct the signals prior to and after the isolation transformer 130. Additionally contemplated herein: a digital solution comprising system 200 elements may function within software to accomplish similar phase corrections. For example, system 200 may be functional within a single chip 290 and within a set of instructions operable on a processor to accomplish method steps incorporated within system 200.

Referring to FIG. 3, a constellation diagrams of an input signal and, after a counterclockwise rotation, an output signal indicative of distortion curable by an embodiment of the present invention is shown. FIGS. 3A and 3B detail an In-Phase (I) along the x axes and a Quadrature (Q) along the y-axes. Shown in FIG. 3A, an exemplary 16 QAM input signal while FIG. 3B shows and exemplary 16 QAM output signal after passing through an amplifier. In FIG. 3A, a uniformity may be indicated by 15 uniformly spaced points such as those four points located along the vertical axis at an Io value of approximately −0.37 indicated by line 310. Such uniformity among points may indicate a non-distorted input signal entering the amplifier. However, the output signal indicated in FIG. 3B may indicate distortion from the non-uniformity of the points along line 320. Power amplifier of system 100 and system 200 may be specifically configured to overcome distortion found in FIG. 3B.

While an exemplary 16QAM input and output signal was indicated in FIGS. 3A and 3B, embodiments herein may be applicable to a variety of modulation type of QAM systems. For example, detailed below is a system configured for 256 QAM for which embodiments of the present invention may be specifically applicable.

Figure 4B:
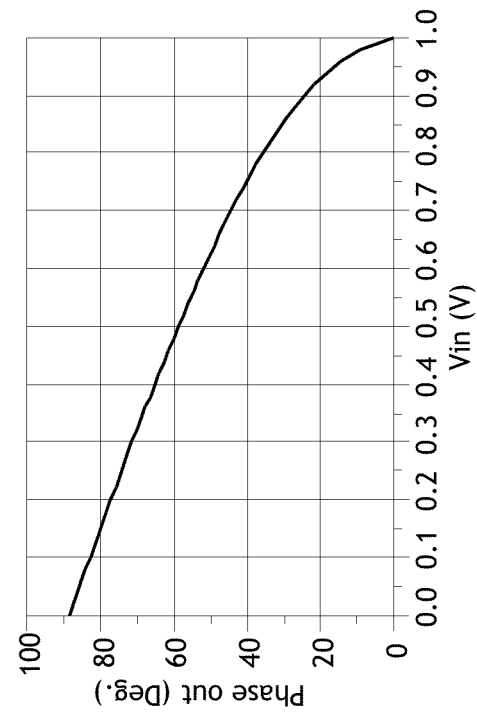
FIG. 4B is a graph of output phase vs. input voltage prior to a phase correction exemplary of an embodiment of the present invention prior to a phase correction exemplary of an embodiment of the present invention.
Figure 4A:
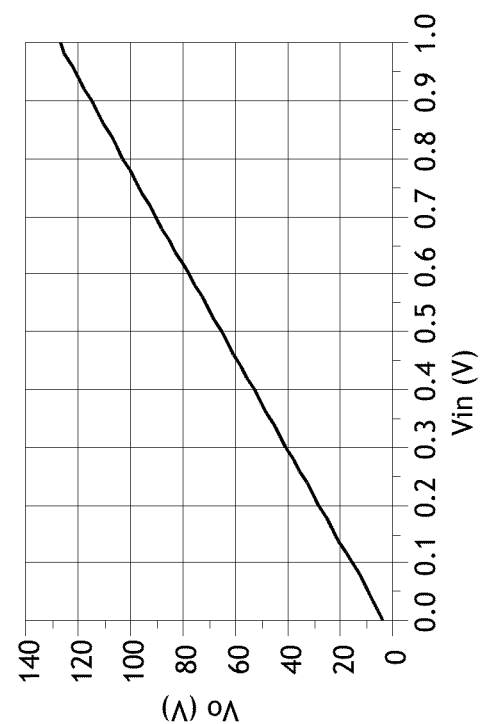
FIG. 4A is a graph of output voltage vs. input voltage exemplary of an embodiment of the present invention.

Referring to FIG. 4A, a graph of output voltage vs. input voltage exemplary of an embodiment of the present invention is shown. As indicated, magnitude of output voltage (y-axes) decreases as input voltage (x-axes) is backed off from maximum.

Referring to FIG. 4B, a graph of output phase vs. input voltage exemplary of an embodiment of the present invention is shown. As indicated, phase distortion increases to undesirable levels as power is backed-off from a maximum.

Figure 5:
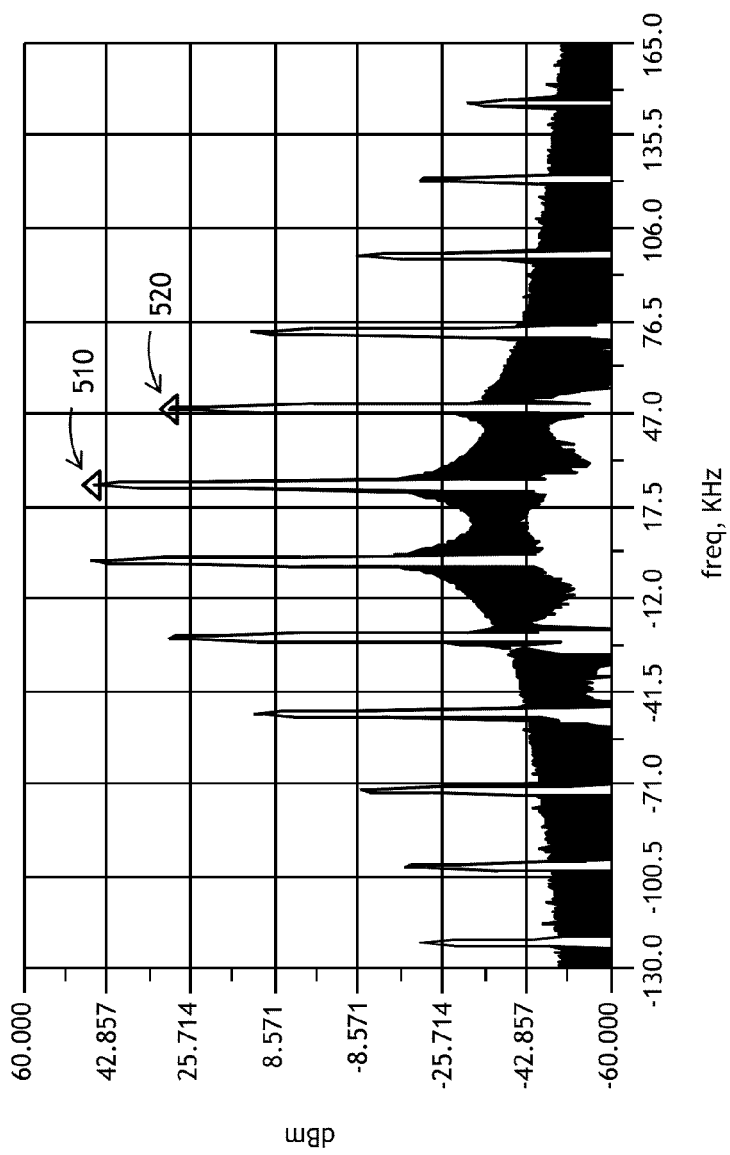
FIG. 5 is a graph of intermodulation distortion illustrative of potential consequences of high phase distortion on generation of intermodulation products in an outphasing amplifier.

Referring to FIG. 5, a graph of intermodulation distortion illustrative of potential consequences of high phase distortion on generation of intermodulation products in an outphasing amplifier is shown. Point 510 represents a frequency of 24 kHz at a dBm of 45 while point 520 represents a dependent delta value of approximately −14.5 to approximately 30.5 dBm. Note that the 3rd order products have been degraded to less than −15 dB of delta, with higher order products maintaining a degraded delta level as well.

Figures 6A, 6B:
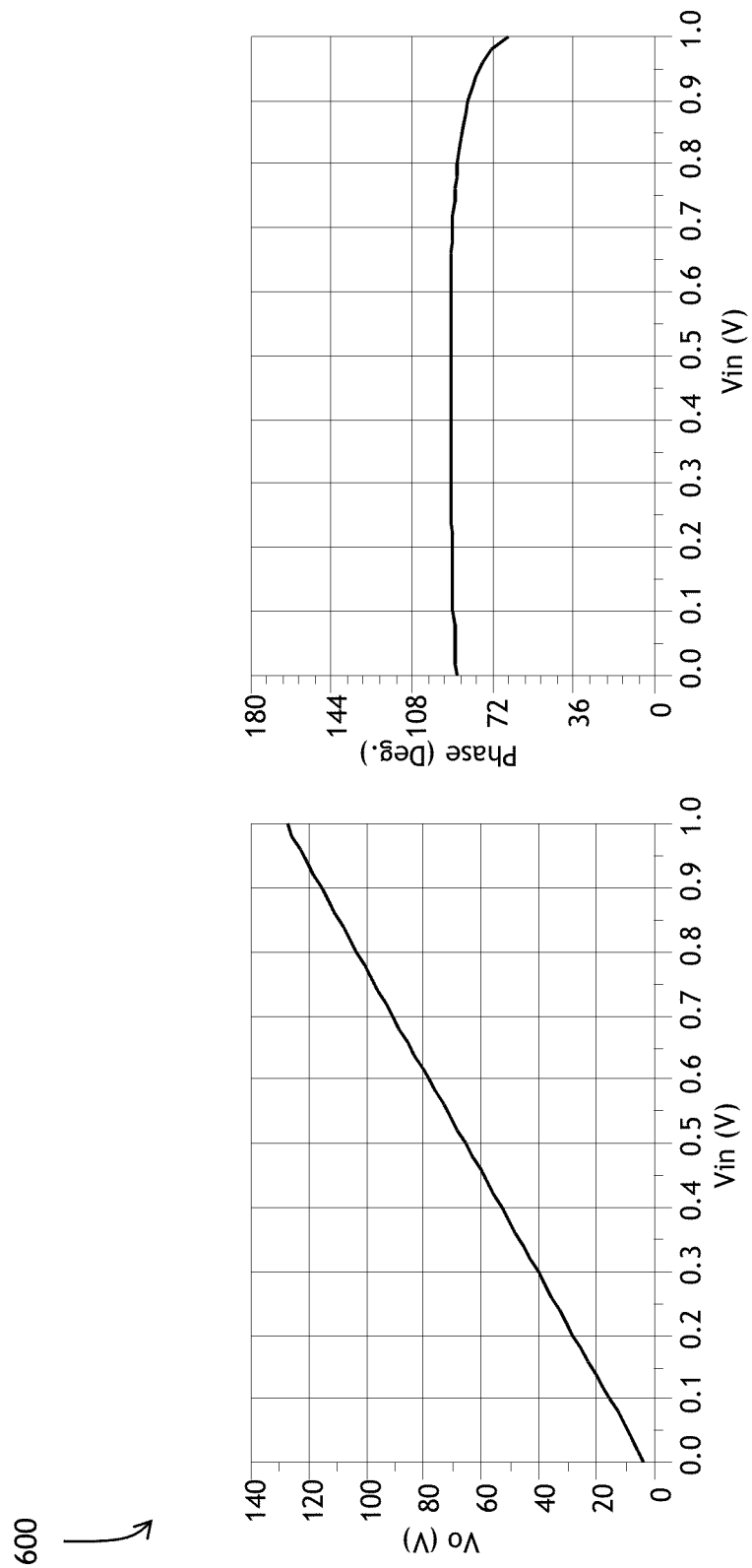
FIGS. 6A, 6B & 6C are graphs of efficiency and phase potential results after phase correction exemplary of an embodiment of the present invention.
Figure 6C:
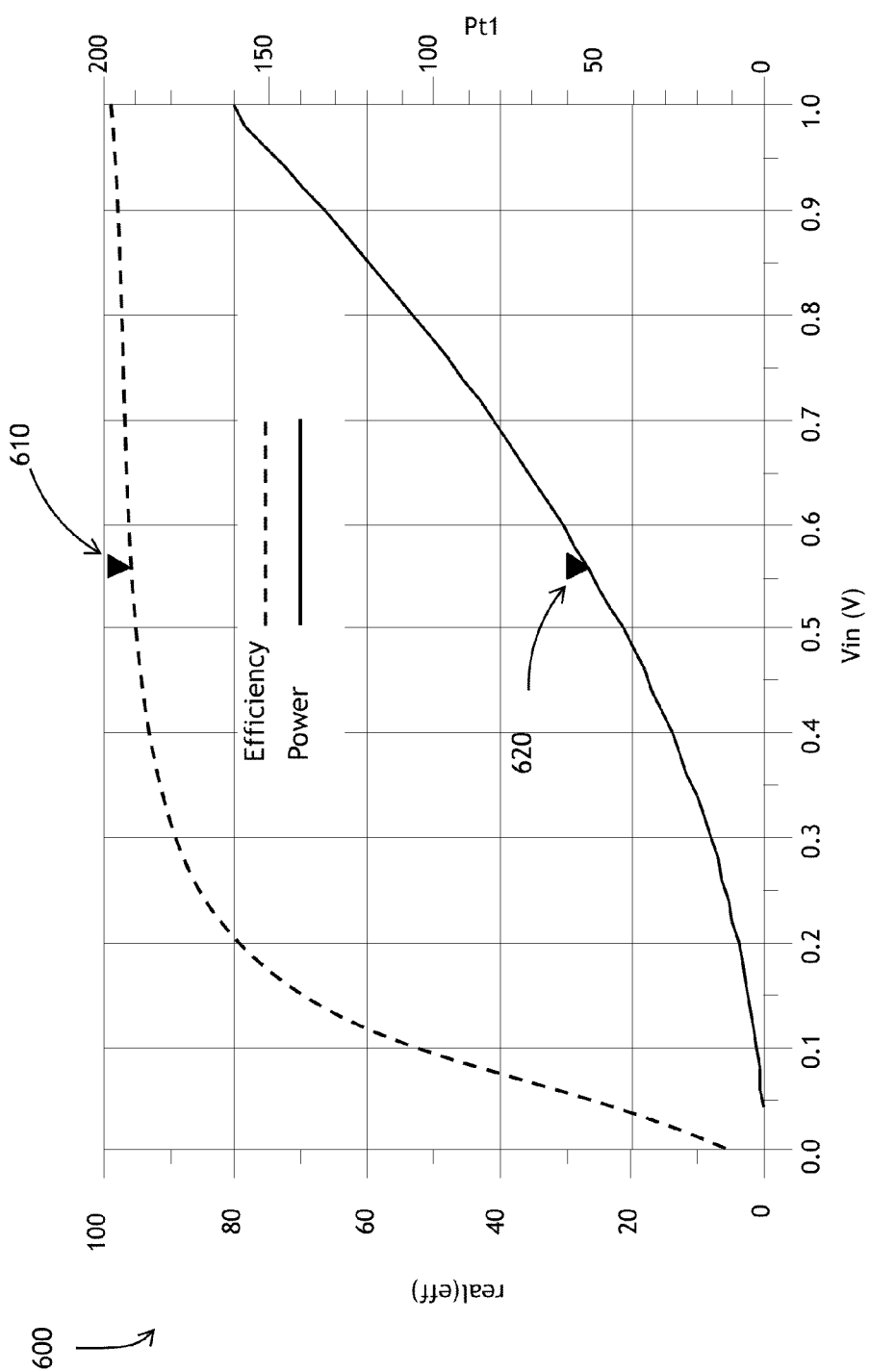

Referring to FIGS. 6A and 6C, graphs of amplitude and phase linearity after phase correction exemplary of an embodiment of the present invention are shown. FIG. 6A indicates a similar curve compared to FIG. 4A of magnitude of output voltage. However, phase distortion curve of FIG. 6B indicates a desirable flattened curve resulting in a lower distortion level at lower power levels. FIG. 6C indicates a real efficiency level at point 610 of approximately 96% at 56 watts output (point 620), representing the average power output of a QAM signal.

Figure 7:
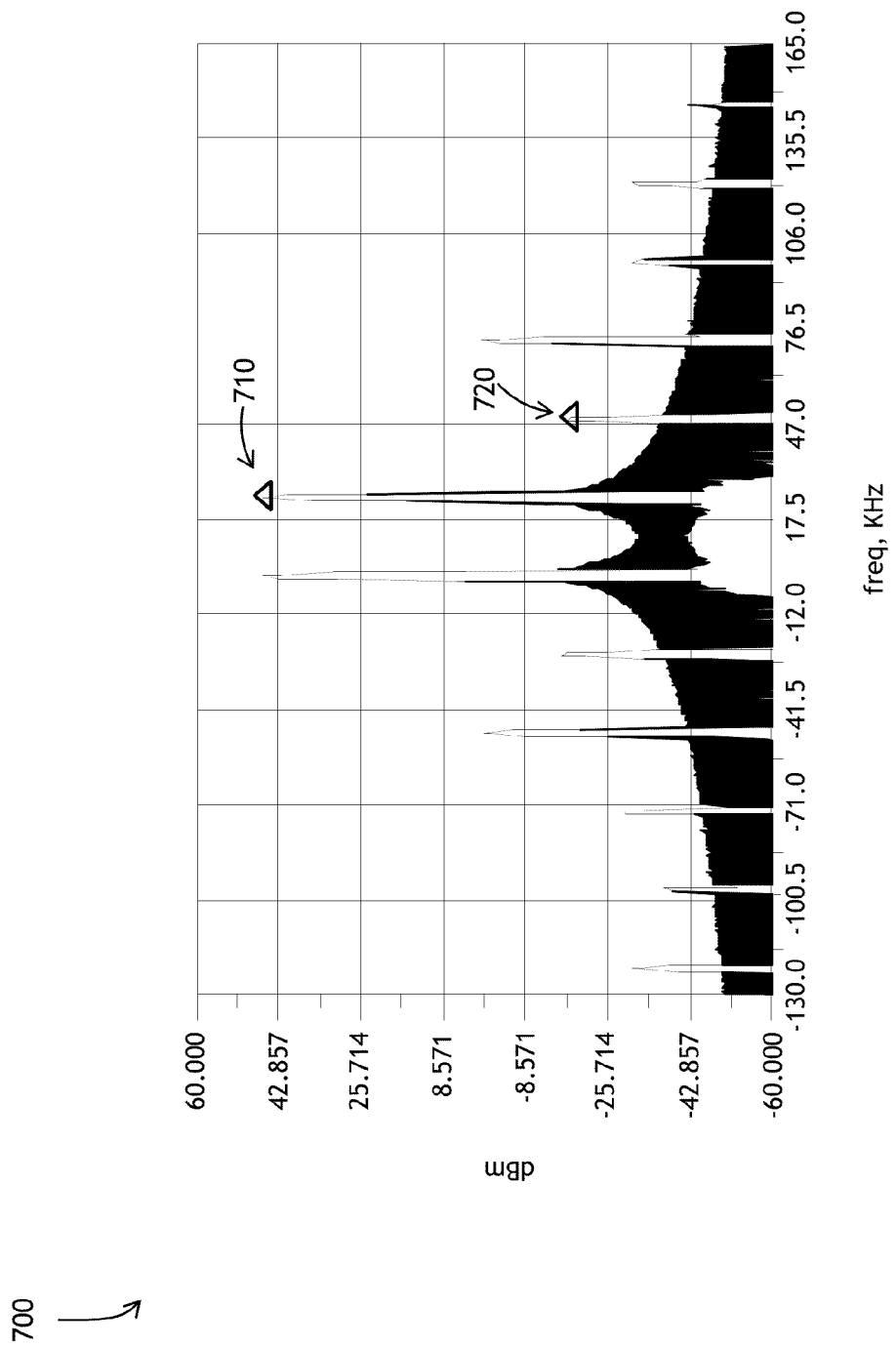
FIG. 7 is a graph of Intermodulation Distortion of the outphasing amplifier after phase correction illustrative of an embodiment of the present invention.

Referring to FIG. 7, a graph of Intermodulation Distortion of the outphasing amplifier after phase correction illustrative of an embodiment of the present invention is shown. FIG. 7 indicates the impact to the $3^{rd}$ order IMD products. The phase correction has reduced the delta from approximately −15 dB to −62 dB. From point 710 at approximately 45.2 dBm to $3^{rd}$ order at point 720 is reduced to approximately −17.1. The system 200 phase correction compensation has provided a significant reduction to the higher order products as well, but to a lesser degree.

Referring to FIGS. 8A and 8B, graphs of a 256 QAM input and output signal in dBm over frequency exemplary of an embodiment of the present invention is shown. With a 256 QAM drive source, Input and output spectrum is indicated over the frequency range from −50 KHz to 50 KHz. With an input Peak to Average Power Ratio (PAPR) of 7.2 and an output PAPR of 6.4, the indicated signals are commensurate with an accurate low distortion amplification.

Figures 9A, 9B:
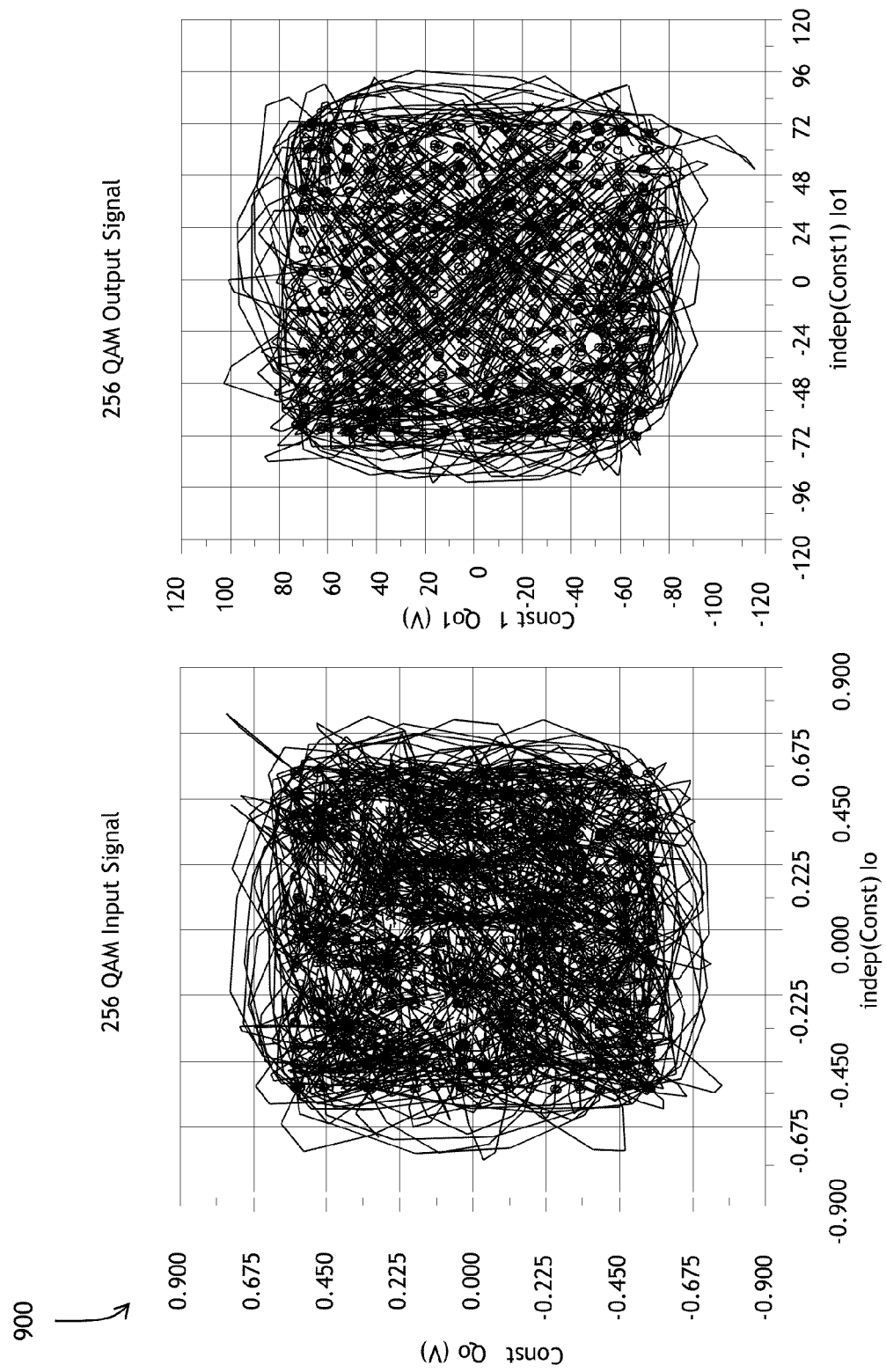
FIGS. 9A and 9B are constellation diagrams of input signal and output signal with volts Q on the Y axes over volts I on the x axes exemplary of an embodiment of the present invention.

Referring to FIGS. 9A and 9B, constellation diagrams of input signal and output signal with volts Q on the Y axes over volts I on the x axes exemplary of an embodiment of the present invention are shown. System 200 reduces the level of distortion as indicated by symmetric grid structure of the nodes of FIG. 9B as compared to the nodes of FIG. 9A. Linear grid structure of the nodes may indicate a low overall distortion of the signal.

One indication of linearity of an amplifier may include an analysis of Error Vector Magnitude (EVM) where a value of two percent (2%) or less may indicate high linearity of a power amplifier. Drawn from FIG. 9B data, an output EVM of 1.386 is indicated as an additional measure of system 200 linearity.

Referring to FIGS. 10A-10D, eye diagrams of input and output signals exemplary of an embodiment of the present invention are shown. One indication of a low, desirable level of distortion in an output signal may include an open portion of a graph or an "eye" shaped open area of the graph. As indicated FIG. 10A shows a 256 QAM I RF input signal 102 while FIG. 10C shows a 256 QAM I RF output signal 104. Both graphs may clearly indicate an eye shaped opening near the left side of the graph indicating a positive low distortion level. Similarly, FIG. 10B indicates a 256 QAM Q input signal 102 while FIG. 10D indicates a 256 QAM Q output signal 104. Again, a clear eye shaped spacing is indicated on both the input and the output signals.

Figure 11A:
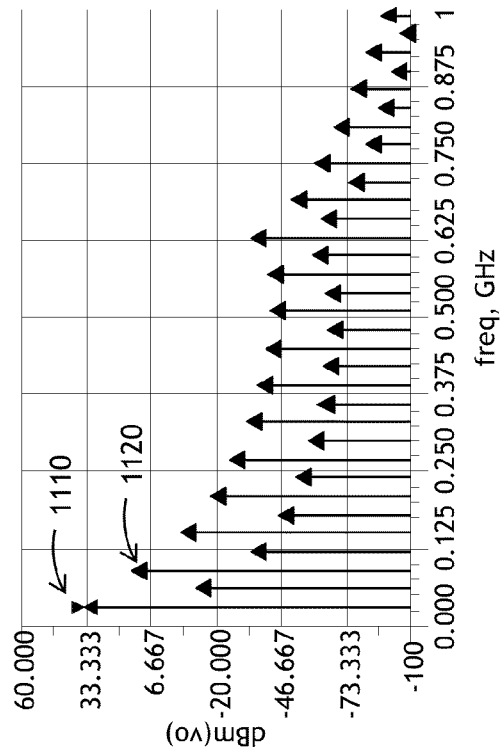
FIG. 11A is a time domain graph of pre-filtered output over time exemplary of an embodiment of the present invention.

Referring to FIG. 11A, a time domain graph of pre-filtered output over time exemplary of an embodiment of the present invention is shown. An accurate time signal switching between positive 10 and negative 10 is indicated at approximately each cycle of approximately 17 nsec for system 200 to create the time domain waveform.

Figure 11B:
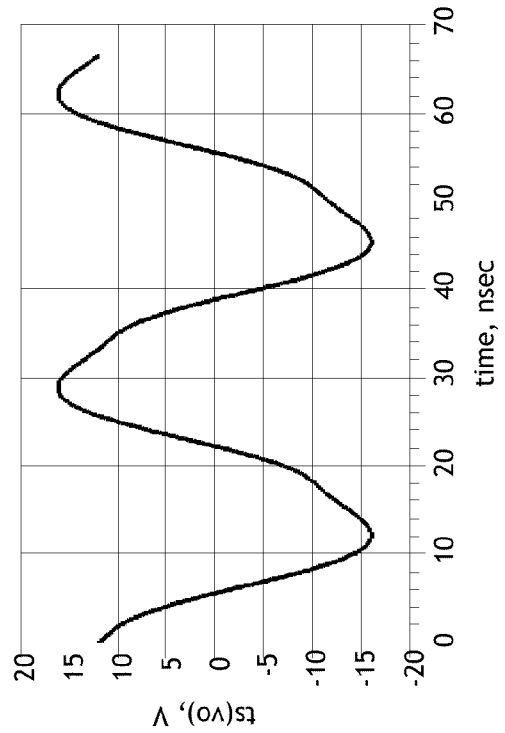
FIG. 11B is a graph of spectral output over frequency indicating harmonics exemplary of an embodiment of the present invention.

Referring to FIG. 11B, a graph of spectral output over frequency indicating harmonics exemplary of an embodiment of the present invention is shown. At the output of the power amplifier, system 200 primary signal 1110 at 30 MHz and 34 dBm is indicated as well as even harmonics along the lower curve and odd harmonics along the upper curve. Specifically, $3^{rd}$ harmonic 1120 maintaining a dependent delta of minus 19.8 to a value of 14.3.

Figure 11C:
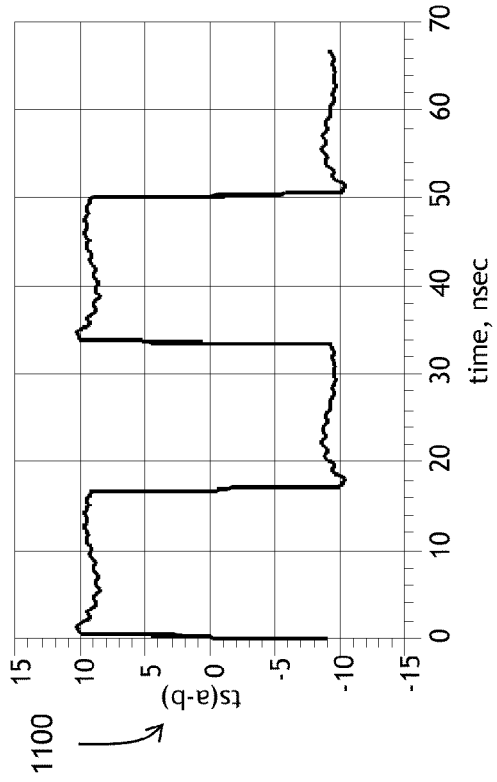
FIG. 11C is a graph of current supplied to the load from each half bridge over time exemplary of an embodiment of the present invention.

Referring to FIG. 11C, a graph of current supplied to the load from each half bridge over time exemplary of an embodiment of the present invention is shown. Matching a similar pattern as time signal in FIG. 11A, current of each system 200 H-bridge left 114 and right 124 cycles between plus and minus approximately 600 mA.

Figure 11D:
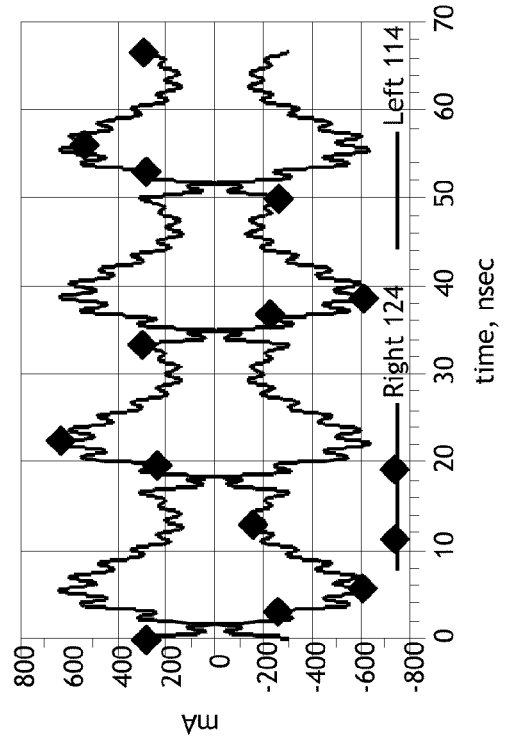
FIG. 11D is a graph of filtered output over time exemplary of an embodiment of the present invention.

Referring to FIG. 11D, a graph of filtered output over time exemplary of an embodiment of the present invention is shown. The waveform at the load is graphically represented with a peak near 15 V. Through analysis of FIGS. 11A-11D, system 200 may preferably produce an output power measured across the load of 2.6 watts with a supplied DC power of 3.4 watts to maintain a DC to RF efficiency of 77%.

Figure 12A:
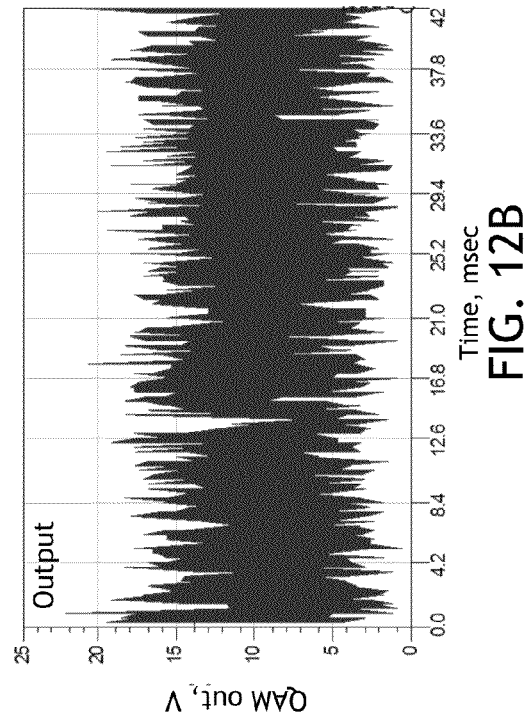
FIGS. 12A, 12B & 12C are graphs of an exemplary 2.5 watt outphasing bridge circuit time domain signal with a 256 QAM drive illustrative of an embodiment of the present invention.
Figure 12B:
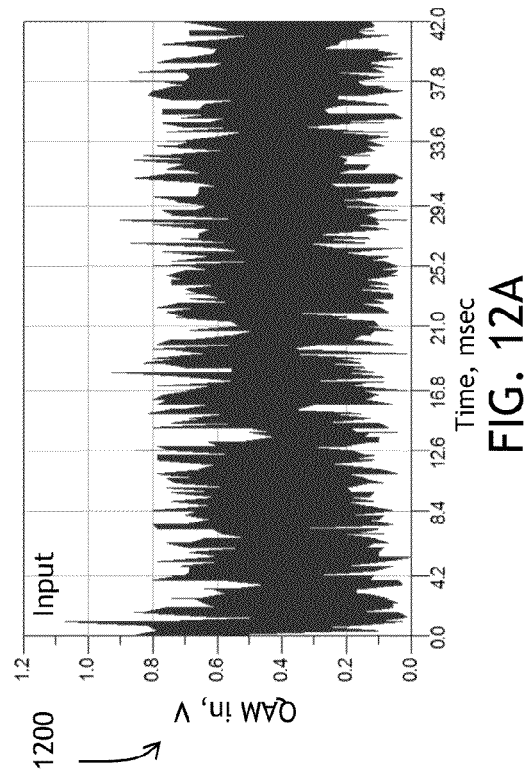
Figure 12C:
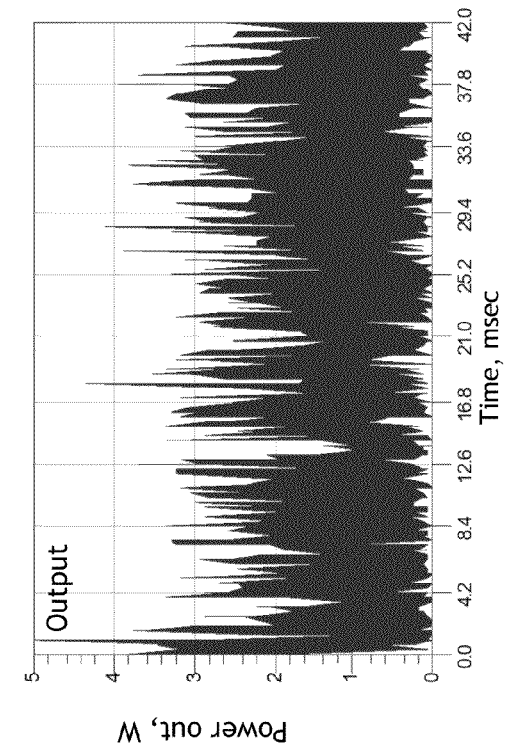

Referring to FIGS. 12A-12C, graphs of an exemplary 2.5 watt outphasing bridge circuit time domain signal with a 256 QAM drive illustrative of an embodiment of the present invention is shown. System 200 input signal represented by FIG. 12A shows a well-defined amplitude with a continuously varying phase component hidden by the graphical RF waveform data. The ability of system 200 to recreate the signal is indicated in FIG. 12B with an accurate representation of the input signal of FIG. 12A recreated in FIG. 12B with an amplified voltage level. System 200 output power represented in FIG. 12C is also an accurate representation of the input signal showing the peak power levels vs. average power levels of the QAM signal.

One goal of the present invention is an efficient power amplifier operating within a high peak to average power range of a specific system. FIG. 12C shows high peaks in the power of the system at approximately 1 msec, 18 msec, and a final peak at 27 msec while the average power of the system is near 1.5 watts. Embodiments of the present invention may operate at acceptable efficiency levels within this high peak to average power ratio requirement.

Figure 13:
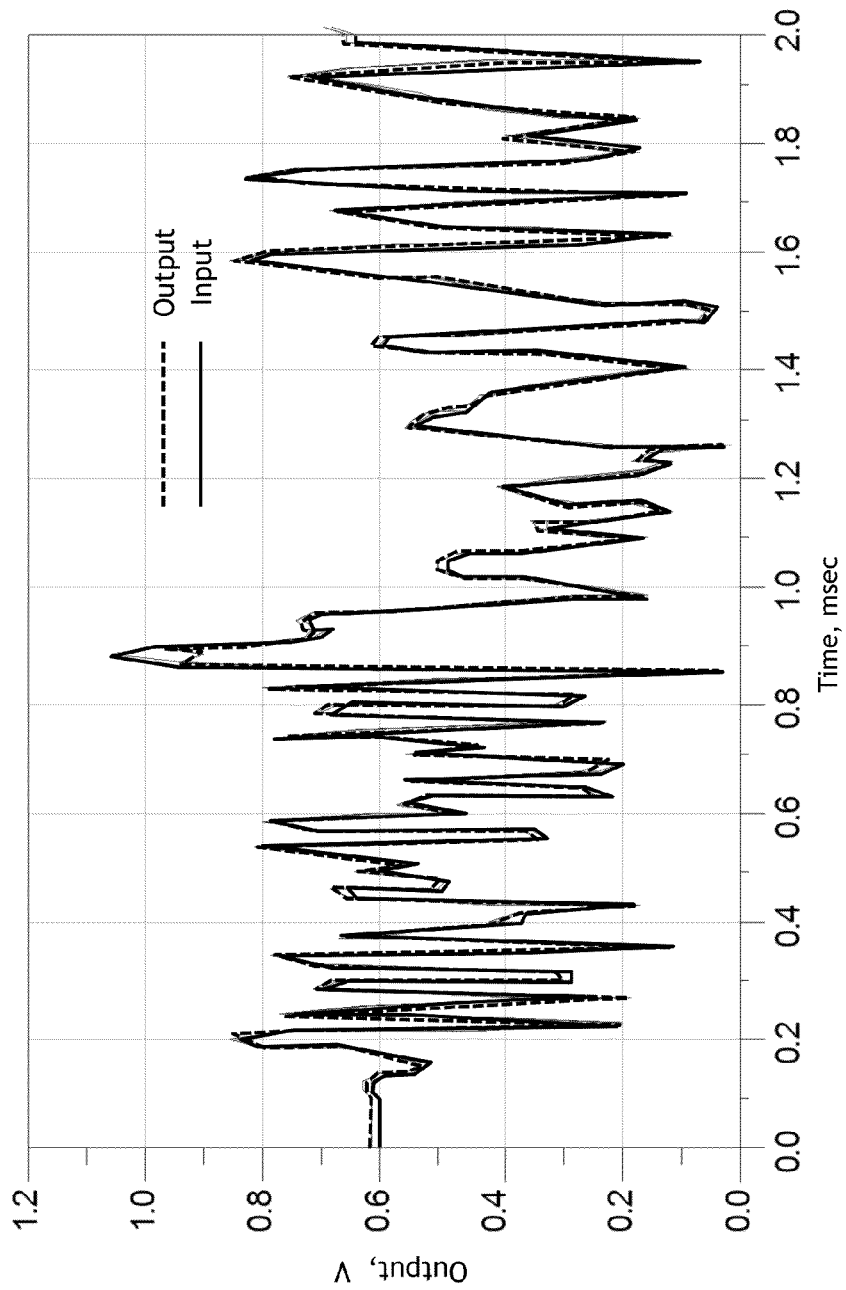
FIG. 13 is a graph of envelope output voltage over time exemplary of an embodiment of the present invention.

Referring to FIG. 13, a graph of envelope output voltage over time exemplary of an embodiment of the present invention is shown. The envelope of the system 200 input signal is graphically represented alongside the envelope of the system 200 output signal. An accurate representation would be indicated by an exact overlay. Here, system 200 output envelope is nearly identical to the system 200 input envelope.

Figure 14:
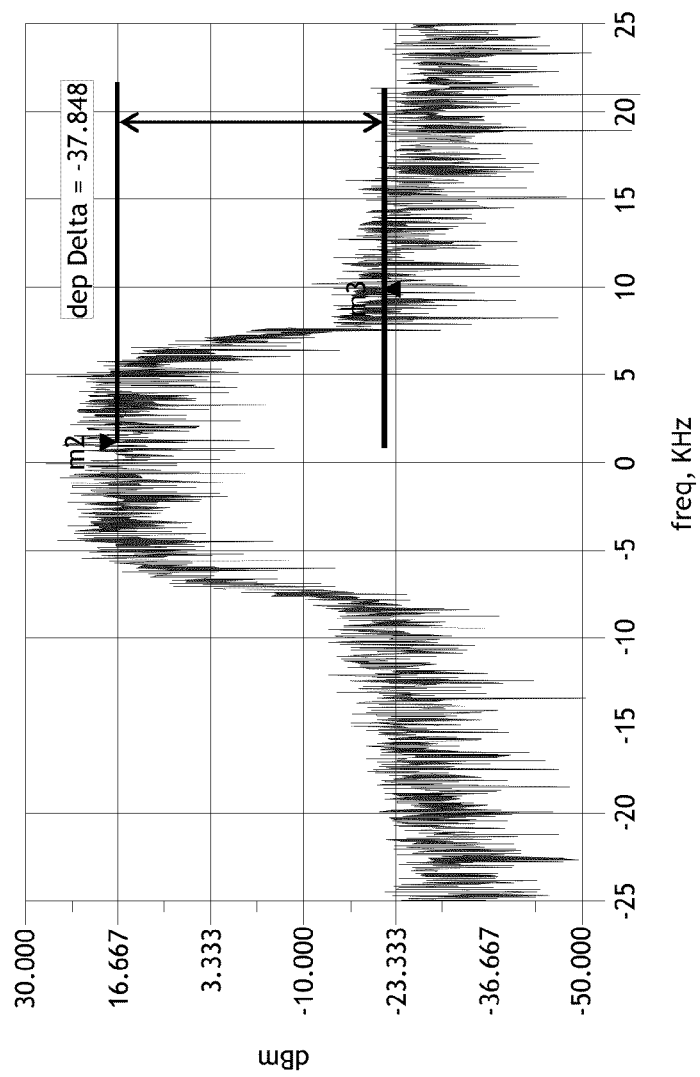
FIG. 14 is a graph of output spectrum of the outphasing amplifier running an exemplary 12 kHz, 256 QAM illustrative of an embodiment of the present invention.

Referring to FIG. 14, a graph of output spectrum of the outphasing amplifier running an exemplary 12 kHz, 256 QAM illustrative of an embodiment of the present invention is shown. Adjacent Channel Power Ratio (ACPR) may include a measurement of output spectrum to determine linearity. System 200 ACPR of 37.848 indicates highly linear performance of the outphasing power amplifier.

Figures 15A, 15B:
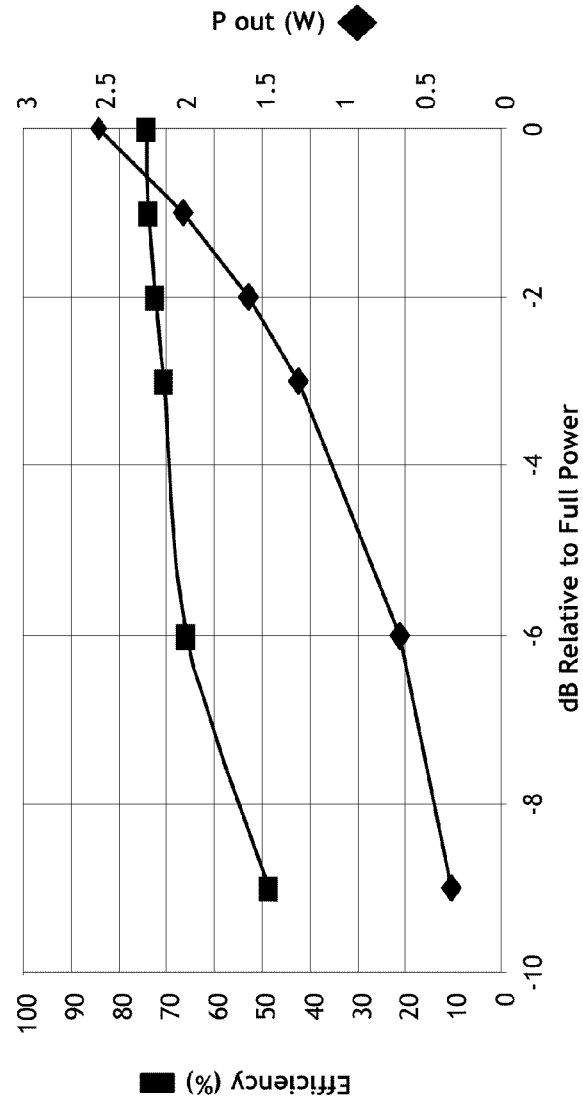
FIG. 15A is a table of measured data of an outphasing amplifier exemplary of an embodiment of the present invention.
FIG. 15B is a combined graph of efficiency (%) and power out (W) over power back off exemplary of an embodiment of the present invention.

Referring to FIG. 15A, a table of measured data of an outphasing amplifier exemplary of an embodiment of the present invention is shown. The dc-to-rf efficiency is measured at 74.1% at full power. Noteworthy in the data is how efficiency remains high as power output is reduced. The efficiency remains close to full performance from zero back-off to approximately six dB of back-off. System 200 capabilities may be desirable in wideband multi tone signals that typically have a peak-to-average ratio (PAR) from 3 to 6 dB. As power is backed off by 9 dB, system 200 may continue operation at nearly 50% efficiency.

Referring to FIG. 15B, a combined graph of efficiency (%) and power out (W) over power back off exemplary of an embodiment of the present invention is shown. As indicated in tabular form above, the system 200 efficiency maintains above 60% to below 6 dB of back-off and just fewer than 50% at 9 dB of back-off.

Efficiency may be one crucial characteristic for performance of an amplifier configured with an embodiment of the present invention. For example, it is contemplated herein: embodiments of the present invention may be configured for function within 256 QAM wideband HF radio applications. Also, to ensure operator physical safety, embodiments of the present invention may be configured within a small form factor handheld radio. In addition, applications maintaining high peak to average ratios requiring long life operation may successfully function with embodiments of the present invention included therein. Further, a conventional single sideband amplifier commonly used in the HF realm may benefit from linearity advantages of embodiments herein.

Figure 16A:
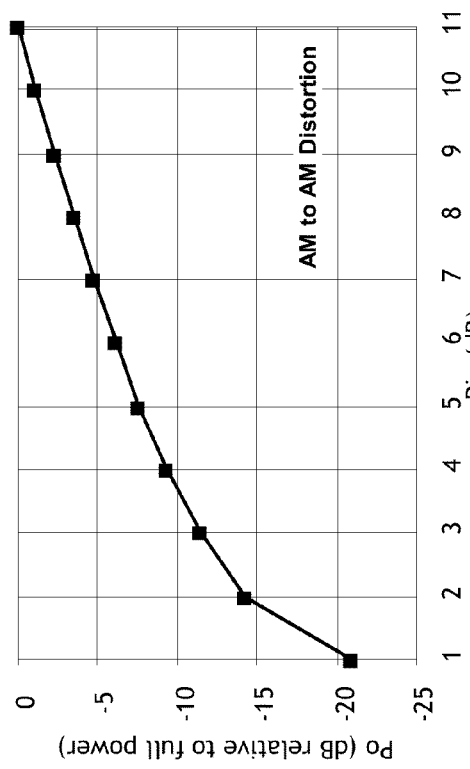
FIG. 16A is a graph of AM to AM distortion indicative of a linear power amplifier exemplary of an embodiment of the present invention.

Referring to FIG. 16A, a graph of AM to AM distortion indicative of a linear power amplifier exemplary of an embodiment of the present invention is shown. The AM-to-AM plot shows that the PA remains fairly linear as power is backed down from full output. However, at lower levels, linearity starts to rapidly degrade.

Figure 16B:
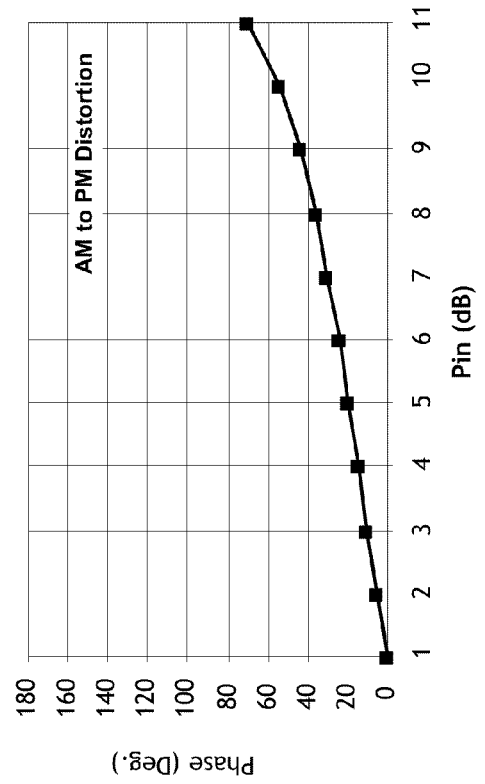
FIG. 16B is a graph of AM to PM distortion showing phase in degrees over input power in dB exemplary of an embodiment of the present invention.

Referring to FIG. 16B, a graph of AM to PM distortion showing phase in degrees over input power in dB exemplary of an embodiment of the present invention is shown. System 200 distortion results in over 70 degrees through the amplifier at full output. It is contemplated herein; pre-distortion may be added at the input of the amplifier to correct for this and improve linearity.

Referring to FIG. 17, a flow diagram for a method for improved linear outphasing power amplifier with improved power back off efficiency exemplary of an embodiment of the present invention is shown. Method 1700 begins at step 1702 with transmitting a RF delay line frequency information, the RF delay line frequency information based on a radio frequency (RF) input, and, at step 1704, transmitting a phase lock signal, the phase lock signal based on the RF input and a forward directional RF output signal, and, at step 1706, transmitting a first RF delay control signal, the first RF delay control signal based on the phase lock signal and a reference current, and, at step 1708, transmitting a second RF delay control signal, the second RF delay control signal based on a filtered RF input and a forward directional RF output signal, and, at step 1710, shifting the phase of the RF input from zero degrees to one hundred eighty degrees based on the RF delay line frequency information and the first RF delay control signal, and, at step 1712, transmitting a first shifted RF input to a first half bridge, and, at step 1714, shifting the phase of the RF input from zero degrees to one hundred eighty degrees based on the RF delay line frequency information and the second RF delay control signal, and, at step 17016, transmitting a second shifted RF input to a second half bridge, and, at step 1718, transmitting a phase corrected output signal through an output filter, the phase corrected output signal based on the first and second shifted RF inputs, and, at step 1720, receiving and splitting the phase corrected output signal into the forward directional RF output signal and a reflected directional RF output signal, and, at step 1722, transmitting a filtered phase corrected output signal, and, at step 1724, transmitting the forward directional RF output signal to a digital phase lock loop and to an amplitude error amplifier; and, at step 1726, compensating for the second shifting means to cancel a phase shift within the means for transmitting a phase corrected output signal.

CONCLUSION

Specific blocks, sections, devices, functions, processes and modules may have been set forth. However, a skilled technologist will realize that there are many ways to partition the system, and that there are many parts, components, processes, modules or functions that may be substituted for those listed above.

While the above detailed description has shown, described and pointed out the fundamental novel features of the invention as applied to various embodiments, it will be understood that various omissions and substitutions and changes in the form and details of the system illustrated may be made by those skilled in the art, without departing from the intent of the invention. The foregoing description details certain embodiments of the invention. It will be appreciated, however, that no matter how detailed the foregoing appears, the invention may be embodied in other specific forms without departing from its spirit or essential characteristics. The described embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A system for linearization of an outphased power amplifier for improved output power back off efficiency, comprising:
   a frequency counter configured for receiving a radio frequency (RF) input and transmitting a RF delay line frequency information, the RF delay line frequency information based on the RF input;
   an amplitude error amplifier configured for:
      receiving a filtered RF input;
      receiving a forward directional RF output signal;
      transmitting a RF delay control signal, the RF delay control signal based on the filtered RF input and the forward directional RF output signal;
   a first phase shifter configured for:
      receiving the RF input;
      receiving the RF delay line frequency information;
      receiving the RF delay control signal;
      shifting the phase of the RF input from zero degrees to positive ninety degrees based on the RF delay line frequency information and the RF delay control signal; and
      transmitting a first shifted RF input to a first half bridge;
   a second phase shifter configured for:
      receiving the RF input;
      receiving the RF delay line frequency information;
      receiving the RF delay control signal;
      shifting the phase of the RF input from zero degrees to negative ninety degrees based on the RF delay line frequency information and the RF delay control signal;
      transmitting a second shifted RF input to a second half bridge;
   a half-bridge output network, the half-bridge output network including the first half bridge and the second half bridge, the half-bridge output network comprising at least two complementary Class-D amplifiers configured to:

receive the first and second shifted RF inputs from each of the first and the second half bridges;
switch a dc supply voltage across a load; and
transmit a phase corrected output signal through an output filter;
a RF directional coupler configured for:
receive the phase corrected output signal;
splitting the phase corrected output signal into the forward directional RF output signal and a reflected directional RF output signal; and
transmitting a filtered phase corrected output signal; and
transmitting the forward directional RF output signal to the amplitude error amplifier.

2. The system for linearization of the outphased power amplifier for improved output power back off efficiency of claim 1, wherein the frequency counter is further configured to provide each of the left first and second phase shifters with a digital word, the digital word allowing each phase shifter to make a course change when changing a frequency band.

3. The system for linearization of the outphased power amplifier for improved output power back off efficiency of claim 1, wherein the amplitude error amplifier is further configured with a precision RF detector and a low pass filter prior to the amplitude error amplifier.

4. The system for linearization of the outphased power amplifier for improved output power back off efficiency of claim 1, wherein the half-bridge output network further comprises a comparator prior to each of the first and second half bridge.

5. The system for linearization of the outphased power amplifier for improved output power back off efficiency of claim 1, wherein the half-bridge output network further comprises an isolation transformer configured to receive each signal from the first and second half bridge and transmit the phase corrected signal to the RF directional coupler.

6. A system for linearization of an outphased power amplifier for improved output power back off efficiency, comprising:
a frequency counter configured for receiving a radio frequency (RF) input and transmitting a RF delay line frequency information, the RF delay line frequency information based on the RF input;
a digital phase lock loop configured for:
receiving the RF input;
receiving a forward directional RF output signal; and
transmitting a phase lock signal;
a phase error amplifier configured for:
receiving the phase lock signal;
receiving a reference current; and
transmitting a first RF delay control signal, the first RF delay control signal based on the phase lock signal and the reference current;
an amplitude error amplifier configured for:
receiving a filtered RF input;
receiving the forward directional RF output signal; and
transmitting a second RF delay control signal, the second RF delay control signal based on the filtered RF input and the forward directional RF output signal;
a first phase shifter configured for:
receiving the RF input;
receiving the RF delay line frequency information;
receiving the first RF delay control signal;
shifting the phase of the RF input from zero degrees to one hundred eighty degrees based on the RF delay line frequency information and the first RF delay control signal; and
transmitting a first shifted RF input to a first half bridge;

a second phase shifter configured for:
receiving the first shifted RF input;
receiving the RF delay line frequency information;
receiving the second RF delay control signal;
shifting the phase of the RF input from zero degrees to one hundred eighty degrees based on the RF delay line frequency information and the second RF delay control signal; and
transmitting a second shifted RF input to a second half bridge;
a half-bridge output network, the half-bridge output network including the first half bridge and the second half bridge, the half-bridge output network comprising at least two complementary Class-D amplifiers configured to:
receive the first and second shifted RF inputs from each of the first and the second half bridges;
switch a dc supply voltage across a load; and
transmit a phase corrected output signal through an output filter;
a RF directional coupler configured for:
receiving the phase corrected output signal;
splitting the phase corrected output signal into the forward directional RF output signal and a reflected directional RF output signal; and
transmitting a filtered phase corrected output signal; and
transmitting the forward directional RF output signal to the digital phase lock loop and to the amplitude error amplifier;
wherein the first phase shifter is configured to compensate for the second phase shifter shifting the phase of the RF input, the compensation configured to cancel any phase shift within the half-bridge output network.

7. The system for linearization of the outphased power amplifier for improved output power back off efficiency of claim 6, wherein the frequency counter is further configured to provide each of the left first and second phase shifters with a digital word, the digital word allowing each phase shifter to make a course change when changing a frequency band.

8. The system for linearization of the outphased power amplifier for improved output power back off efficiency of claim 6, wherein the amplitude error amplifier is further configured with a precision RF detector and a low pass filter prior to the amplitude error amplifier.

9. The system for linearization of the outphased power amplifier for improved output power back off efficiency of claim 6, wherein the half-bridge output network further comprises a comparator prior to each of the first and second half bridge.

10. The system for linearization of the outphased power amplifier for improved output power back off efficiency of claim 6, wherein the half-bridge output network further comprises an isolation transformer configured to receive each signal from the first and second half bridge and transmit the phase corrected signal to the RF directional coupler.

11. The system for linearization of the outphased power amplifier for improved output power back off efficiency of claim 6, wherein the digital phase lock loop is further configured to provide a direct current output proportional to a difference between the phases of: the RF input and the forward directional RF output signal.

12. A method for linearization of an outphased power amplifier for improved output power back off efficiency, comprising:
means for transmitting a RF delay line frequency information, the RF delay line frequency information based on a radio frequency (RF) input;

means for transmitting a phase lock signal, the phase lock signal based on the RF input and a forward directional RF output signal;

means for transmitting a first RF delay control signal, the first RF delay control signal based on the phase lock signal and a reference current;

means for transmitting a second RF delay control signal, the second RF delay control signal based on a filtered RF input and a forward directional RF output signal;

a first shifting means for shifting the phase of the RF input from zero degrees to one hundred eighty degrees based on the RF delay line frequency information and the first RF delay control signal;

means for transmitting a first shifted RF input to a first half bridge;

a second shifting means for shifting the phase of the RF input from zero degrees to one hundred eighty degrees based on the RF delay line frequency information and the second RF delay control signal;

means for transmitting a second shifted RF input to a second half bridge;

means for transmitting a phase corrected output signal through an output filter, the phase corrected output signal based on the first and second shifted RF inputs;

means for receiving the phase corrected output signal;

means for splitting the phase corrected output signal into the forward directional RF output signal and a reflected directional RF output signal;

means for transmitting a filtered phase corrected output signal;

means for transmitting the forward directional RF output signal to a digital phase lock loop and to an amplitude error amplifier; and means for compensating for the second shifting means to cancel a phase shift within the means for transmitting a phase corrected output signal.

13. The method for linearization of the outphased power amplifier for improved output power back off efficiency of claim 12, wherein the means for transmitting a RF delay line frequency information is further configured with a providing means for providing each of the first and second shifting means with a digital word, the digital word allows each of the first and second shifting means to make a course change when changing a frequency band.

14. The method for linearization of the outphased power amplifier for improved output power back off efficiency of claim 12, wherein the means for transmitting a phase lock signal further comprises a means for precise detection of the RF input and a means for filtering the phase lock signal.

15. The method for linearization of the outphased power amplifier for improved output power back off efficiency of claim 12, wherein the means for transmitting a phase lock signal further comprises a means for comparing a phase of at least two input signals.

16. The method for linearization of the outphased power amplifier for improved output power back off efficiency of claim 12, wherein the first shifting means further comprises one of: a means for shifting a phase from zero to positive ninety degrees, and a compensation means for correcting a phase error within the means for transmitting a phase corrected output signal.

17. The method for linearization of the outphased power amplifier for improved output power back off efficiency of claim 12, wherein the second shifting means further comprises one of: a shifting means for shifting a phase from zero to negative ninety degrees, and a shifting means for shifting a phase from zero to one hundred eighty degrees.

18. The method for linearization of the outphased power amplifier for improved output power back off efficiency of claim 12, wherein the means for splitting the phase corrected output signal further comprises a receiving means and a dividing means, the dividing means for dividing the phase corrected output signal into at least three signals including at least one of: a filtered phase corrected output signal, a forward directional RF output signal, and a reflected directional RF output signal.

19. The method for linearization of the outphased power amplifier for improved output power back off efficiency of claim 12, wherein the means for compensating for the second shifting means further comprises a phase correction based on the forward directional RF output signal.

* * * * *